United States Patent [19]
Hershey

[11] Patent Number: 5,550,879
[45] Date of Patent: Aug. 27, 1996

[54] MOTOR CURRENT SIGNAL PROCESSOR INCLUDING PHASE LOCKED AND DELTA MODULATED LOOPS

[75] Inventor: John E. Hershey, Ballston Lake, N.Y.

[73] Assignee: General Electric Company, Schenectady, N.Y.

[21] Appl. No.: 521,501

[22] Filed: Aug. 30, 1995

[51] Int. Cl.$^6$ .................................................. H03D 3/24
[52] U.S. Cl. ........................... 375/376; 327/299; 327/551; 318/629
[58] Field of Search ........................... 375/376; 327/299, 327/361, 362, 355, 549, 551, 552, 555, 556; 318/611, 629; 455/206, 305, 306

[56] References Cited

U.S. PATENT DOCUMENTS

| | | | |
|---|---|---|---|
| 5,124,657 | 6/1992 | Waller, Jr. | 327/551 |
| 5,448,598 | 9/1995 | Yousefi et al. | 327/299 |

OTHER PUBLICATIONS

"Methods of Motor Current Signature Analysis" by G. B. Klinman, et al., Electric Machines & Power Systems, 20:463–474, 1992.

Primary Examiner—Stephen Chin
Assistant Examiner—Thuy L. Nguyen
Attorney, Agent, or Firm—Ann M. Agosti; Marvin Snyder

[57] ABSTRACT

A signal processor includes a phase looked loop for estimating a largest sine wave component phase and frequency element of an incoming analog signal to provide a component signal and a delta-adjusted subtraction loop for removing a largest sine wave component of the incoming signal. The subtraction loop includes a gain adapter for monitoring an output signal and calculating a gain for minimizing the magnitude of the output signal, a multiplier for multiplying the gain by the component signal to provide a multiplied signal, and a subtractor for subtracting the multiplied signal from the incoming analog signal and supplying the output signal to the gain adapter. The gain adapter in one embodiment includes an algorithm capable of repeating the following sequence during a predetermined period of time: adapting a gain by adding a voltage limit; calculating a present maximum absolute value of a subtracted signal (the output signal) over a measurement cycle; comparing the present maximum absolute value with a previous maximum absolute value and, if the present maximum absolute value is greater, changing the sign of the voltage limit, and adapting the gain by adding the voltage limit; multiplying the voltage limit by a fraction having a value less than one; and changing the previous maximum absolute value to the present maximum absolute value.

7 Claims, 2 Drawing Sheets

MOTOR CURRENT SIGNAL PROCESSOR INCLUDING PHASE LOCKED AND DELTA MODULATED LOOPS

CROSS-REFERENCE TO RELATED APPLICATION

This application is related to the following co-pending application which is commonly assigned: A. A. Abdel-Malek et al., "Motor Current Signal Processor Using Analog Subtraction of an Estimated Largest Sine Wave Component," U.S. application Ser. No. 08/521,503, filed concurrently herewith.

BACKGROUND OF THE INVENTION

Special signal processing can be performed in motor control centers to determine fault conditions of rotating machinery such as a broken or damaged bar in an induction motor, for example. One technique described in G. B. Kliman and J. Stein, "Methods of Motor Current Signature Analysis," Electric Machines and Power Systems, vol. 20, pp. 463–474, 1992, ascertains a broken bar condition by interpreting the power line spectra. The signals that are important for diagnosis are of very small magnitude as compared to the largest sine wave component, which is typically the fundamental (first harmonic) component of the line current occurring at a frequency of about 60 hertz. The frequency location of signals that are used to diagnose a broken bar are dependent on the slip and the synchronous speed (which is a function of the number of poles and the frequency of the largest sine wave component).

A long term fourier transform can be used both to reduce the windowing leakage that results from sampling a time limited waveform and to determine the presence of a frequency component produced by a broken bar. A long term fourier transform, however, has several limitations. For example, the largest sine wave component frequency can vary during a long term average. Furthermore, the motor's load can vary with time, thus altering the slip and spreading the signal of interest over a wider frequency range to reduce its peak power per hertz. Additionally, a large magnitude component requires that a digital signal analysis system quantize data in such a way that the necessary dynamic range is provided. Proposed extensions of these techniques to motor faults other than broken bars requires increased sensitivity and dynamic range on the order of 90–110 decibels.

Demodulation on the 60 Hz carrier (largest component) and extremely narrow band (notch) filtering have been used in attempts to remove the largest sine wave component before signal processing. A limitation of simple demodulation is the potential aliasing of the frequencies below the largest sine wave frequency, and a limitation of notch filtering is the small modulation of the largest sine wave frequency and therefore the differing degrees of attenuation due to the filter's "skirts" resulting in artifact modulations.

SUMMARY OF THE INVENTION

The present invention performs subtraction of the largest sine wave component prior to quantization and signal analysis without directly estimating the largest sine wave component by using concatenated phase locked and delta-modulated loops. The invention results in a reduced number of bits needed in an analog-to-digital (A/D) converter of a digital signal processor as compared with the required number of bits if the largest sine wave component were not significantly reduced because prior removal of such component will greatly reduce the required dynamic range.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
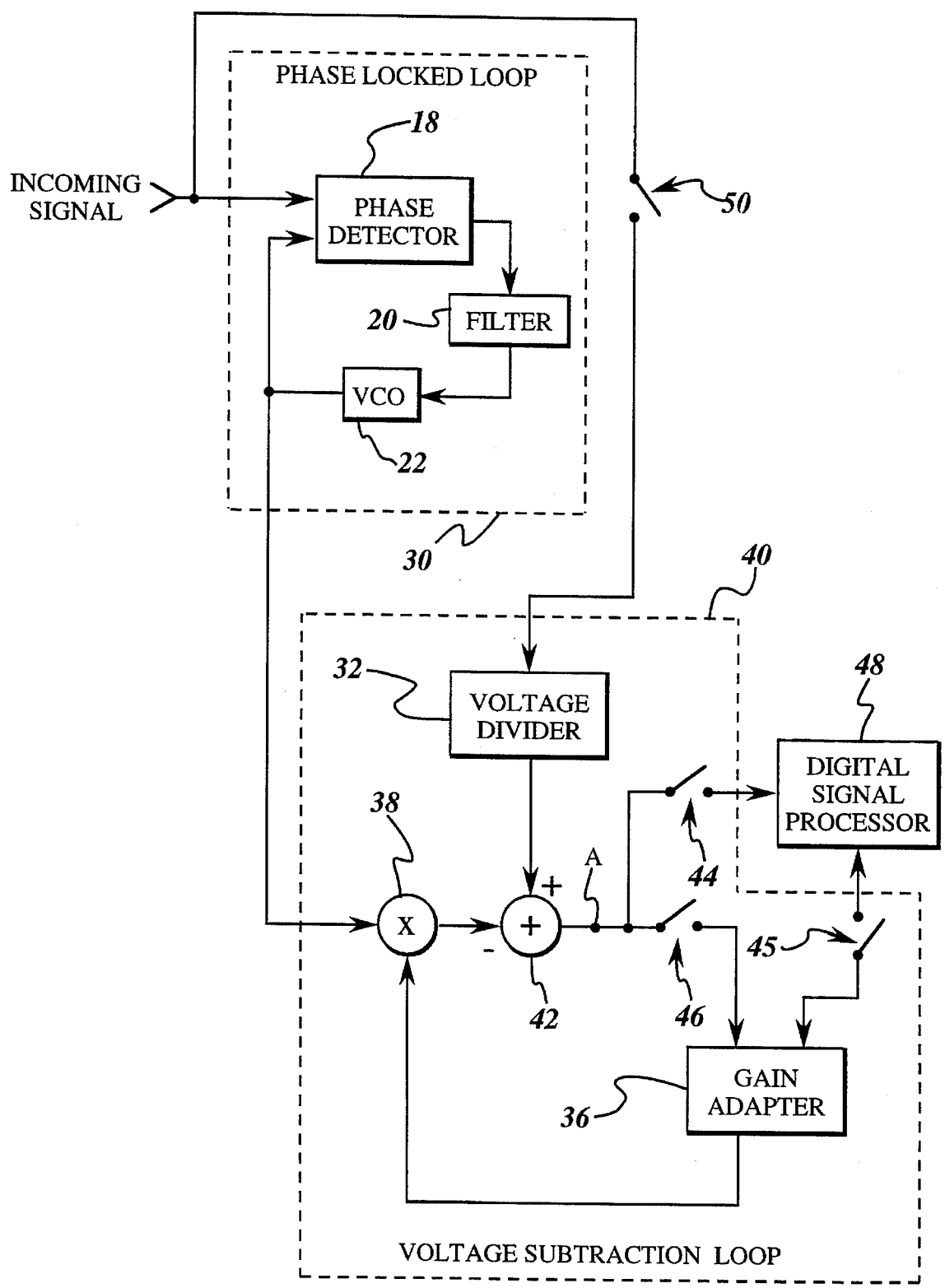
FIG. 1 is a block diagram of an embodiment of the present invention.

FIG. 1 is a block diagram of an embodiment of the present invention. An incoming signal such as a current is directed to an analog phase locked loop (PLL) 30 and to a delta-adjusted voltage subtraction loop 40. A switch 50 prevents the incoming signal from reaching loop 40 for an initial period of time which is long enough for a phase detector of the PLL to sufficiently acquire the proper phase. In one embodiment, the initial period is 10 seconds.

It is assumed that the largest sine wave component (typically at 60 Hz) of a current signal is very large as compared with the other signals of interest. Therefore a first order PLL can be used. If desired, higher order loops can be used, as shown by the presence of a loop filter 20. In the embodiment of FIG. 1, the phase locked loop comprises a phase detector 18, loop filter 20, and a voltage controlled oscillator (VCO) 22.

For a first order loop there is no filter and the loop has the transfer function:

$$H(j\omega)=K/(j\omega+K),$$

wherein K represents the loop gain in radians per second. VCO 22 receives the output signal from the phase detector if a first order loop is used (or the output signal from the loop filter 20 if a higher order loop is used) and supplies a VCO output signal to phase detector 18.

Preferably, the central angular frequency of the VCO is set to the line frequency, e.g., $2\pi \times 60$ radians-Hz, and K is set to $2\pi$ radians-Hz. Therefore the synchronization range of the loop is approximately 59–61 hertz. PLL 30 thus recovers nearly the exact frequency and phase of the largest sine wave component.

After switch 50 is closed, delta-adjusted voltage subtraction loop 40 is used to drive the voltage at node A towards zero and thereby remove the largest sine wave component of the incoming signal such that signals representative of faults or other abnormalities remain.

In one embodiment, the subtraction loop operates by multiplying using multiplier 38 the largest sine wave phase detected from the PLL by a varying gain (parameter) from gain adapter 36. The multiplied signal is then subtracted using subtractor 42 from the incoming signal or, in one embodiment as shown in FIG. 1, from a fixed fractional multiple (provided by voltage divider 32) of the incoming signal. The fractional multiplier can be chosen by determining two parameters, (a) the maximum voltage Vp desirable for transmission to a selected digital signal processor 48 and (b) the maximum voltage of the input signal Vi, and then dividing Vp by Vi. The value of Vp is chosen based on the voltage range of the selected digital signal processor.

Gain adapter 36 continually compares the difference (supplied by subtractor 42) between the fixed fractional multiple of the incoming signal and the signal generated by the multiplication of the PLL and gain adapter signals. The gain adapter adjusts its gain to drive the maximum absolute value (the magnitude) of the difference towards zero. The gain adapter may comprise analog circuitry (not shown) or a digital computer. If a digital computer is used, an analog-to-digital converter (not shown) can couple subtractor 42 to the gain adapter and a digital-to-analog converter (not shown) can couple the gain adapter to multiplier 38.

Figure 2:
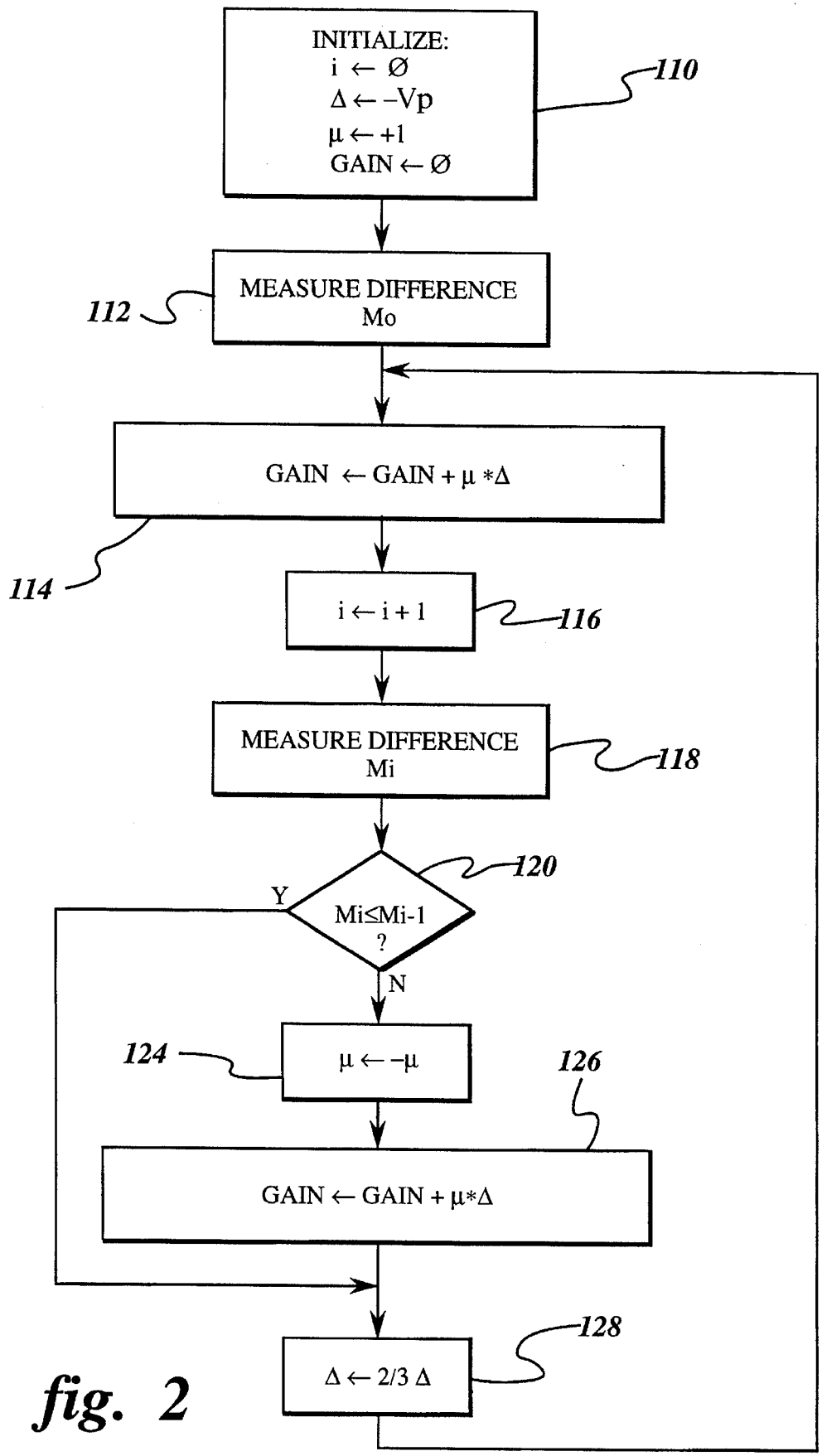
FIG. 2 is a flow chart of one method of implementing the embodiment of FIG. 1.

One embodiment for driving the magnitude of the difference towards zero includes an algorithm represented in flow chart format by FIG. 2. At step 110, parameters are initialized. A counter i is set to zero; a value $\Delta$ is set to $-Vp$ (the negative value of the maximum voltage desirable for transmission to the signal processor); a sign indicator $\mu$ is set to $+1$; and a gain value is set to zero.

At step 112 the maximum absolute value $M_o$ (or a monotonically increasing function of the maximum absolute value) of the difference signal of subtractor 42 is monitored over a measurement cycle. $M_o$ is a parameter which can have units comprising voltage, energy, or current. In a preferred embodiment, $M_o$ represents a voltage value. A maximum value of $M_o$ over a measurement cycle can be obtained by the gain adapter's use of either an A/D converter and algorithm for digital analysis or an analog sample and hold element. The measurement cycle during which the determination of the maximum absolute value occurs is chosen to be one cycle for the largest sine wave component. For a line current of 60 hertz, a cycle can be $\frac{1}{60}$ seconds, for example.

At step 114, the value of gain is changed in accordance with a signal from the gain adapter 36 to become the previous value of the gain plus $\mu \times \Delta$.

At step 116 the counter is incremented by 1. Then at step 118, a maximum absolute value $M_i$ of the difference signal of subtractor 42 at node A is obtained over a cycle in the same manner that $M_o$ was calculated. It is then determined at step 120 whether $M_i$ (a present maximum absolute value) is less than or equal to $M_o$, or the immediately preceding $M_{i-1}$ (a previous maximum absolute value). If so, then the value of $\Delta$ is reduced by one third at step 128, and the process loops back to step 114 where the value of the gain is again changed by adding $\mu \times \Delta$.

If instead the value of $M_i$ has increased ($M_i > M_{i-1}$), then at step 124, the sign indicator $\mu$ is changed to $-1$ at step 124, and the gain is changed by adding $\mu \times \Delta$ at step 126. Because $\mu$ has changed signs, the gain is back to its previous value before its alteration at step 114. At step 128, the value of $\Delta$ is reduced. In one example, the value of $\Delta$ is reduced by multiplying $\Delta$ by a fraction having a value less than one (shown as $\frac{2}{3}$ in FIG. 2). The process loops back to step 114 where the value of the gain is again changed by adding $\mu \times \Delta$.

This process is repeated until the differential correction loop feedback is opened at switch 46 and switch 44 is closed (switches 44 and 46 shown in FIG. 1). When switch 46 is opened, the gain accumulation period has produced a final gain value which is then used during the transmission of data through closed switch 44 to the digital signal processor.

The opening of switch 46 and the closing of switch 44 preferably occur after 120 periods of the largest sine wave frequency (which is approximately 2 seconds for a 60 Hz line) after the start of operation of the delta-adjusted voltage subtraction loop.

The digital signal processor can then convert the signal to digital form and further manipulate and analyze the signal using conventional spectrum analyzing techniques such as those described in aforementioned Kliman et al.

If the value of the maximum amplitude of the largest sine wave component of the incoming signal is needed for data analysis by the digital signal processor, it can be estimated by multiplying the final gain value by the intrinsic amplitude of voltage controlled oscillator 22 and by Vi/VP (the reciprocal of the fractional multiplier discussed with respect to voltage divider 32 above). The result approximates the maximum amplitude and can be passed to the digital signal processor using switch 45 at the end of the gain accumulation period.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A signal processing device comprising:
  a phase locked loop for locking a largest sine wave component phase and frequency element of an incoming analog signal to provide a component signal; and
  a delta-adjusted subtraction loop for removing a largest sine wave component of the incoming analog signal, the delta-adjusted subtraction loop including
    a gain adapter for monitoring an output signal and calculating a gain for minimizing the magnitude of the output signal,
    a multiplier for multiplying the gain by the component signal to provide a multiplied signal, and
    a subtractor for subtracting the multiplied signal from at least a portion of the incoming analog signal and supplying the output signal to the gain adapter.

2. The signal processing device of claim 1, further comprising a voltage divider for dividing the incoming analog signal by a predetermined amount to provide the at least a portion of the incoming analog signal.

3. A signal processing device comprising:
  a phase locked loop for locking a largest sine wave component phase and frequency element of an incoming analog signal to provide a component signal;
  a delta-adjusted voltage subtraction loop for removing a largest sine wave component of the incoming analog signal, the delta-adjusted voltage subtraction loop including
    a voltage divider for dividing the incoming analog signal by a predetermined amount to provide a divided signal,
    a gain adapter for monitoring an output signal and calculating a gain for minimizing the magnitude of the output signal,
    a multiplier for multiplying the gain by the component signal to provide a multiplied signal, and
    a subtractor for subtracting the multiplied signal from the divided signal and supplying the output signal to the gain adapter;
  a digital signal processor for analyzing the output signal; and
  a switch for coupling the digital signal processor to the subtractor after a predetermined period of time.

4. A signal processing method comprising the steps of:

locking the largest sine wave component phase and frequency element of an incoming analog signal to provide a component signal; and removing the largest sine wave component of the incoming analog signal by repeating the following sequence for a predetermined period of time multiplying the component signal by a gain to provide a multiplied signal, subtracting the multiplied signal from at least a portion of the incoming analog signal to provide a subtracted signal, and monitoring the subtracted signal and adapting the gain to minimize the magnitude of the subtracted signal.

5. The method of claim 4, wherein the step of subtracting the multiplied signal from at least a portion of the incoming analog signal to provide a subtracted signal includes dividing the incoming analog signal by a predetermined amount to provide the at least a portion of the incoming analog signal.

6. The method of claim 4, wherein the step of removing the largest sine wave component further comprises prior to multiplying and subtracting, (a) obtaining a voltage limit representing the negative value of the maximum voltage desirable for transmission to a digital signal processor;

(b) setting a gain value to zero;

simultaneously with multiplying and subtracting, (c) calculating a maximum absolute value of the subtracted signal over a measurement cycle, the maximum absolute value comprising a previous maximum absolute value; and (d) repeating the following sequence during a remainder of the predetermined period of time (1) adapting the gain by adding the voltage limit to the gain, (2) calculating a present maximum absolute value of the subtracted signal over a measurement cycle, (3) comparing the present maximum absolute value with the previous maximum absolute value and, if the present maximum absolute value is greater,
 a) changing the sign of the voltage limit, and
 b) adapting the gain by adding the voltage limit to the gain;

(4) adapting the voltage limit by multiplying the voltage limit by a fraction having a value less than one; and (5) changing the previous maximum absolute value to the present maximum absolute value.

7. A signal processing method comprising the steps of:

locking the largest sine wave component phase and frequency element of an incoming analog signal to provide a component signal; and removing the largest sine wave component of the incoming analog signal by repeating the following sequence for a predetermined period of time multiplying the component signal by gain to provide a multiplied signal, dividing the incoming analog signal by a predetermined amount to provide a divided signal subtracting the multiplied signal from the divided signal to provide a subtracted signal, and monitoring the subtracted signal and determining if the subtracted signal has an increasing magnitude, and if the subtracted signal has an increasing magnitude, adapting the gain to drive the magnitude of the subtracted signal towards zero.

* * * * *